US007797939B2

(12) United States Patent  
Green

(10) Patent No.: US 7,797,939 B2
(45) Date of Patent: Sep. 21, 2010

(54) CONCENTRATING SOLAR ENERGY RECEIVER

(76) Inventor: Timmy Green, 343 Alden Cove Dr., Smyrna, TN (US) 37167

( * ) Notice: Subject to any disclaimer, the term of this patent is extended or adjusted under 35 U.S.C. 154(b) by 336 days.

(21) Appl. No.: 12/151,029

(22) Filed: May 3, 2008

(65) Prior Publication Data

US 2009/0272425 A1  Nov. 5, 2009

(51) Int. Cl.
- F03G 6/00 (2006.01)
- F03G 7/00 (2006.01)
- F01B 29/08 (2006.01)
- F24J 2/00 (2006.01)
- F24J 2/08 (2006.01)
- F24J 2/10 (2006.01)

(52) U.S. Cl. .......... 60/641.15; 60/641.8; 60/641.14; 60/516; 126/569; 126/683

(58) Field of Classification Search .......... 60/641.8, 60/641.11, 641.12, 641.13, 641.14, 641.15; 126/440, 437, 271, 561–713
See application file for complete search history.

(56) References Cited

U.S. PATENT DOCUMENTS

| | | | | |
|---|---|---|---|---|
| 2,182,222 A | * | 12/1939 | Courtis et al. | 126/607 |
| 4,000,733 A | * | 1/1977 | Pauly | 126/680 |
| 4,191,164 A | * | 3/1980 | Kelly | 126/683 |
| 4,238,246 A | * | 12/1980 | Genequand et al. | 136/248 |
| 4,286,581 A | * | 9/1981 | Atkinson, Jr. | 126/585 |
| 4,496,787 A | * | 1/1985 | Touchais et al. | 136/248 |
| 4,784,700 A | * | 11/1988 | Stern et al. | 136/248 |
| 5,374,317 A | * | 12/1994 | Lamb et al. | 136/246 |
| 5,540,216 A | * | 7/1996 | Rasmusson | 126/683 |
| 6,881,893 B1 | * | 4/2005 | Cobert | 136/246 |

* cited by examiner

Primary Examiner—Thomas E Denion
Assistant Examiner—Christopher Jetton

(57) ABSTRACT

A concentrating solar receiver that maximizes the amount of solar energy available for conversion to electricity that utilizes a primary reflector, a secondary reflector and a fresnel lens to both reflect and refract solar rays to a thermal cycle engine receiver which converts solar energy to mechanical energy which is in turn converted into electrical energy using an electric generator. The configuration creates focal points that protect the thermal cycle engine receiver from high temperatures and provides uniform density of solar energy within the thermal cycle engine receiver. The solar receiver is moved in response to a sun tracking sensor using a vertical and a horizontal drive motor. The thermal cycle engine and the electric generator, representing the majority of mass, are centered on the vertical support and are low to the ground.

16 Claims, 7 Drawing Sheets

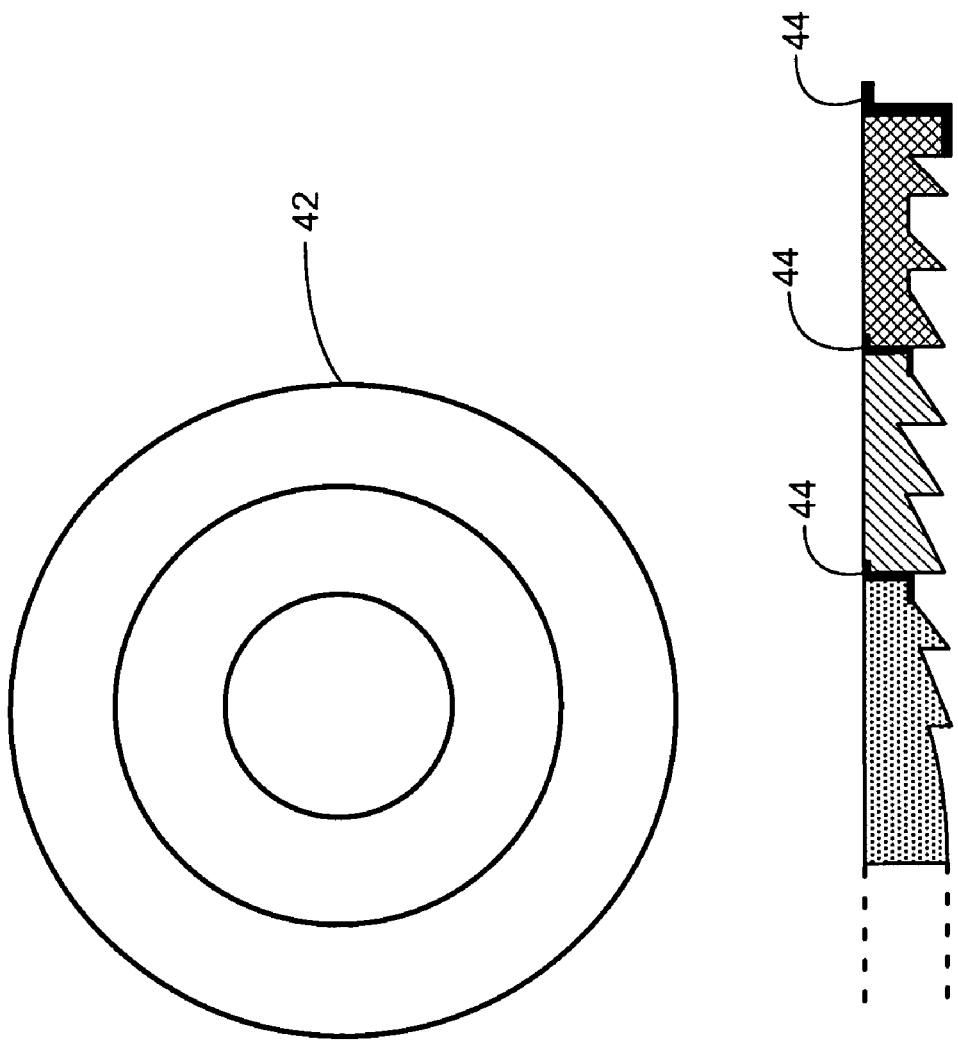

CONCENTRATING SOLAR ENERGY RECEIVER

TECHNICAL FIELD OF THE INVENTION

This invention relates generally to the field of solar energy conversion and more particularly to an improved concentrating solar energy receiver.

BACKGROUND OF THE INVENTION

Prior Art

Devices for solar energy collection are well known in the prior art and include non-concentrating types and concentrating types. Non-concentrating types intercept parallel unconcentrated rays of the sun with an array of detection or receiving devices such as a solar panel of photovoltaic cells or hot water pipes, for example. A concentrating type collector focuses energy rays using a parabolic reflector or lens assembly to concentrate the rays and create an intense beam of energy.

Conventional concentrating solar energy receivers fail to maximize the amount of solar energy available for conversion to electricity. Current designs, such as that disclosed in U.S. Pat. No. 5,882,433 to Horne limit the available solar energy by using configurations that block sunlight from reaching the reflectors. The thermal cycle engine and electric generator in these designs are located short of the focal point of the primary reflector and prevent sunlight from reaching the reflector. The support structure that positions the engine and generator blocks additional sunlight. Further, the thermal cycle engine and the electric generator, representing the majority of mass in this conventional design, are suspended on a long supporting structure high above the ground.

An improved design that uses a more efficient configuration disclosed in U.S. Pat. No. 6,818,818 to Bareis positions the thermal cycle engine and electric generator so that it does not block sunlight from reaching the reflectors and uses a primary parabolic reflector and a secondary parabolic reflector. However, it is now the secondary parabolic reflector that blocks sunlight from reaching the primary parabolic reflector. In this configuration, the majority of mass represented by the thermal cycle engine and electric generator is centered on the vertical support and much lower to the ground.

The present invention utilizes a Fresnel lens in conjunction with the primary reflector and secondary reflector to concentrate the maximum amount of solar energy in the receiver of the thermal cycle engine. By refracting with the Fresnel lens and redirecting with the secondary reflector and utilizing a more efficient configuration of the major components, the present invention utilizes sunlight that would have been lost using current solar concentrating receivers. Additionally, the focal points in the present invention protect the thermal cycle engine receiver from high temperatures and provide uniform density of solar energy within the receiver. Further, the thermal cycle engine and the electric generator, representing the majority of mass, are centered on the vertical support and lower to the ground instead of being suspended high above the ground.

SUMMARY OF THE INVENTION

There is disclosed herein a concentrating solar energy receiver comprising a primary reflector, a secondary reflector, a thermal cycle engine receiver, a Fresnel lens, an electric generator, a rotating vertical support post, a stationary vertical support post, a vertical drive motor, a horizontal drive motor, a stationary gear, a plurality of support struts, a sun tracking sensor and a base.

The stationary vertical support post is located on top of the base. A horizontal drive motor is mounted on top of the stationary vertical support post and rotates the rotating vertical support post located above the horizontal motor in a circular motion directed by the sun tracking sensor. A vertical drive motor is located at the top of the rotating vertical support post and inside the electric generator and elevates the primary reflector, electric generator, thermal cycle engine receiver, secondary reflector and Fresnel lens according to directions from the sun tracking sensor.

The electric generator is coupled to the thermal cycle engine receiver using a drive shaft and such configuration forms a center of gravity between the center of the rotating vertical support post and below the center of the primary reflector. Energy rays are focused from the primary reflector and are intercepted by the secondary reflector which focuses the energy rays towards a focal point located at an empty space located above the thermal cycle engine receiver. This serves to protect the thermal cycle engine receiver from high temperatures produced by the focal point and provides a uniform density of solar energy within the thermal cycle engine receiver. Energy rays are also refracted from the Fresnel lens toward the same focal point located at the empty space located above the thermal cycle engine receiver. This further serves to protect the thermal cycle engine receiver from the high temperatures produced by the focal point and provides a uniform density of solar energy within the thermal cycle engine receiver. The Fresnel lens captures solar energy that is wasted in current configurations.

The primary reflector is flat in shape out to a first diameter equal to the diameter of the Fresnel lens. A plurality of support struts is mounted at the outer edge of the diameter of the primary reflector at equidistant locations along the diameter and extends upwards. The Fresnel lens and the secondary reflector are mounted along these support struts.

The thermal cycle engine receiver converts solar energy from the primary reflector, secondary reflector and Fresnel lens to mechanical energy. The driveshaft connecting the thermal cycle engine and the electric generator conveys the mechanical energy to the electric generator. The electric generator converts the mechanical energy into electric energy.

The Fresnel lens and unique configuration of the present invention maximize the amount of solar energy available to conversion to electricity. The amount of solar energy available is limited by the overall diameter of any concentrating solar receiver. Local wind conditions are the determining factor involved with that diameter. The Fresnel lens could be made of any single material or a combination of several. While a single material version comprised of acrylic, polycarbonate or other suitable material would be most cost effective and durable, the range of an electromagnetic radiation transmittance of a single material is limited compared to the range available for concentrating solar receiver applications.

In a preferred embodiment, the Fresnel lens would be constructed of multiple materials that correspond to each range of electromagnetic radiation from solar energy. These different materials would occupy separate sections of the lens with the highest transmission rates found in the central section where the angles of incidence and emergence are the lowest. The transmission rates decrease as those angles increase toward the edge of the lens. As electromagnetic radiation wavelengths increase, their ability to transmit through mediums increase. As the edge of the Fresnel lens is approached the radiation has to refract through more material. The longer wavelengths are more capable of this refraction. In a preferred embodiment, each material of the Fresnel lens would allow the maximum transmittance of the particular wavelength range that most efficiently penetrates that section of the lens, thereby broadening the overall range of electromagnetic radiation the Fresnel lens can effectively concentrate. Increased efficiency of the compound material Fresnel lens compensates for difficulty in manufacturing and decreased durability. An example of the preferred embodiment compound Fresnel lens is comprised of an acrylic central section with a transmittance of 90% from 0.25 µm to 1.25 µm, a polycarbonate middle section with a transmittance of 85% from 0.7 µm to 2.1 µm, and an IR polycarbonate outer section with a transmittance of 70% from 2.1 µm to 3 µm wherein µm is the wavelength and the transmittance is based on lens nominal thickness of ⅛". However, the number of Fresnel lens sections need not be limited to three layers. In a preferred embodiment, the Fresnel lens is supported by a structure consisting of circular rings with flanges used to construct the compound Fresnel lens. However, the outer edge of each lens section could be beveled and an adhesive that tolerates high temperatures and adverse weather could be used in order to reduce the shadowing effect of the circular rings.

BRIEF DESCRIPTION OF THE DRAWINGS

FIG. 2B illustrates the Fresnel lens support assembly of the present concentrating solar receiver.

DETAILED DESCRIPTION OF THE DRAWINGS

Figure 1:
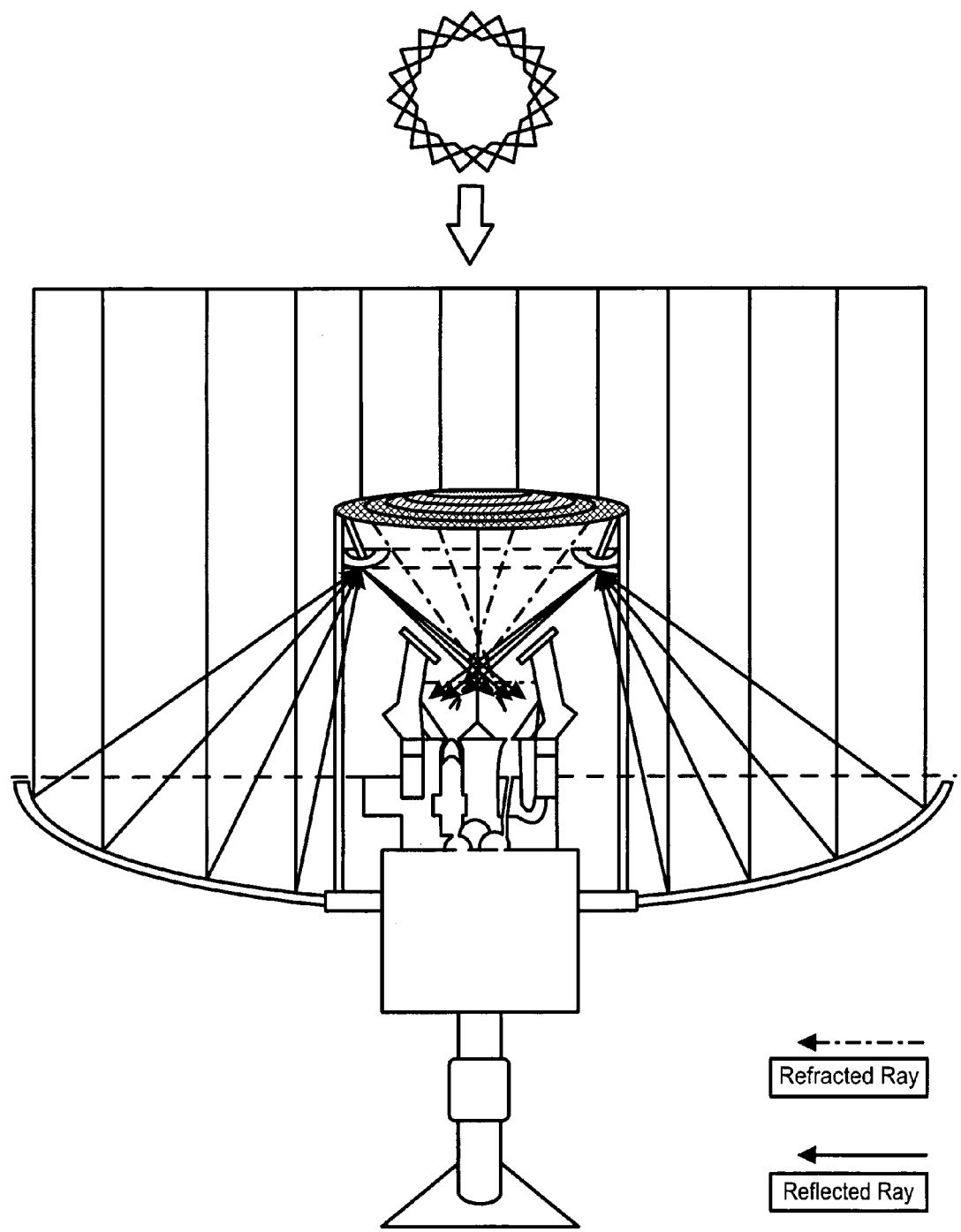
FIG. 1 illustrates the present concentrating solar receiver indicating the direction of refracted and reflected ray from the sun.

Turning first to FIG. 1, there is illustrated the relationship between the reflected and refracted ray and the present invention. This configuration illustrates that all solar energy is captured as the present invention uses both refracted and reflected rays to generate electrical energy.

Figure 1A:
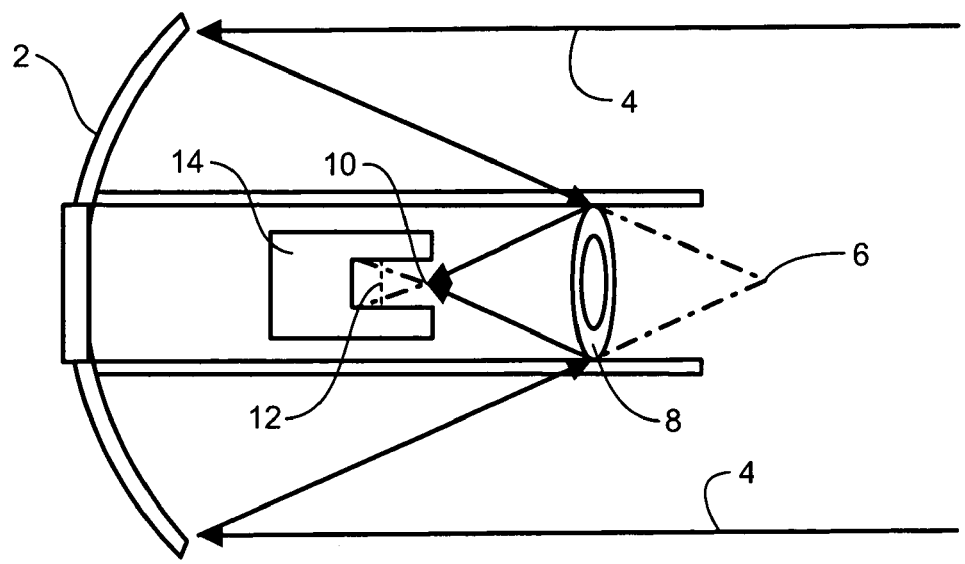
FIG. 1A illustrates the relationship between the present concentrating solar receiver's primary reflector, primary reflector's focal point, secondary reflector and secondary reflector's focal point as shown in cross section.

Referring to FIG. 1A, there is illustrated the present concentrating solar receiver. A primary reflector 2 of either a single parabolic dish or many reflective panels arranged in a parabolic shape is shown in cross section. Constructed of polished aluminum, solar energy in the form of a plurality of rays 4 is focused from the concave side of the dish toward a focal point 6. Before reaching the focal point 6 the rays are intercepted by a circular secondary reflector 8 with a convex shaped surface. The secondary reflector's focal point 10 is located just outside the window 12 of a thermal cycle engine receiver 14. The purpose of this is to protect the window from the higher temperatures of the focal point 10 and to provide uniform density of solar energy within the receiver 14.

Figure 1B:
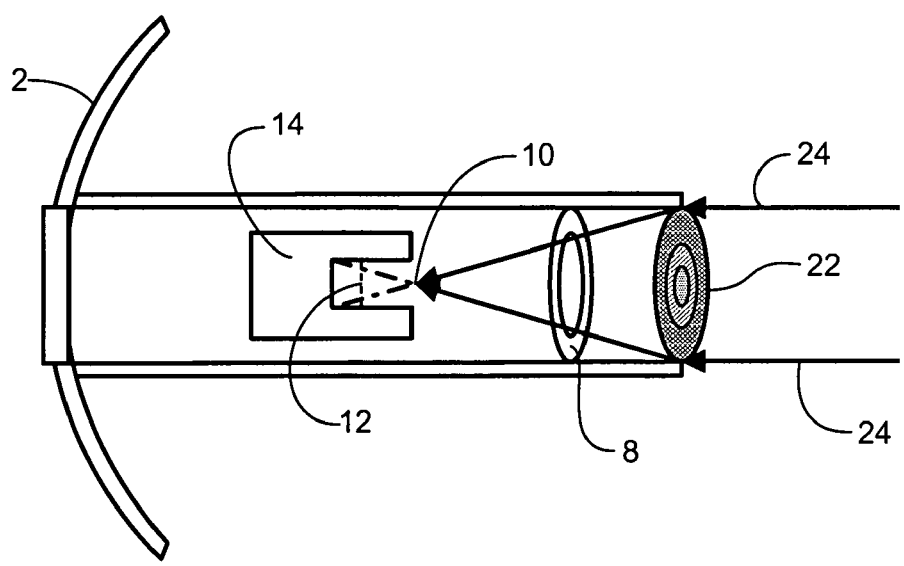
FIG. 1B illustrates the relationship between the present concentrating solar receiver's Fresnel lens, Fresnel len's focal point, secondary reflector and secondary reflector's focal point as shown in cross section.

FIG. 1B continues illustrating the present invention. The primary reflector 2 is again shown in cross section. A Fresnel lens 22 refracts solar energy rays 24 toward a focal point 10. These rays pass through the opening of the "donut shaped" secondary reflector 8 on their way to the focal point 10 just outside the window 12 of the thermal cycle engine receiver 14. Once again, this arrangement allows the solar energy density to be uniformly distributed inside the thermal cycle engine receiver 14.

Figure 2A:
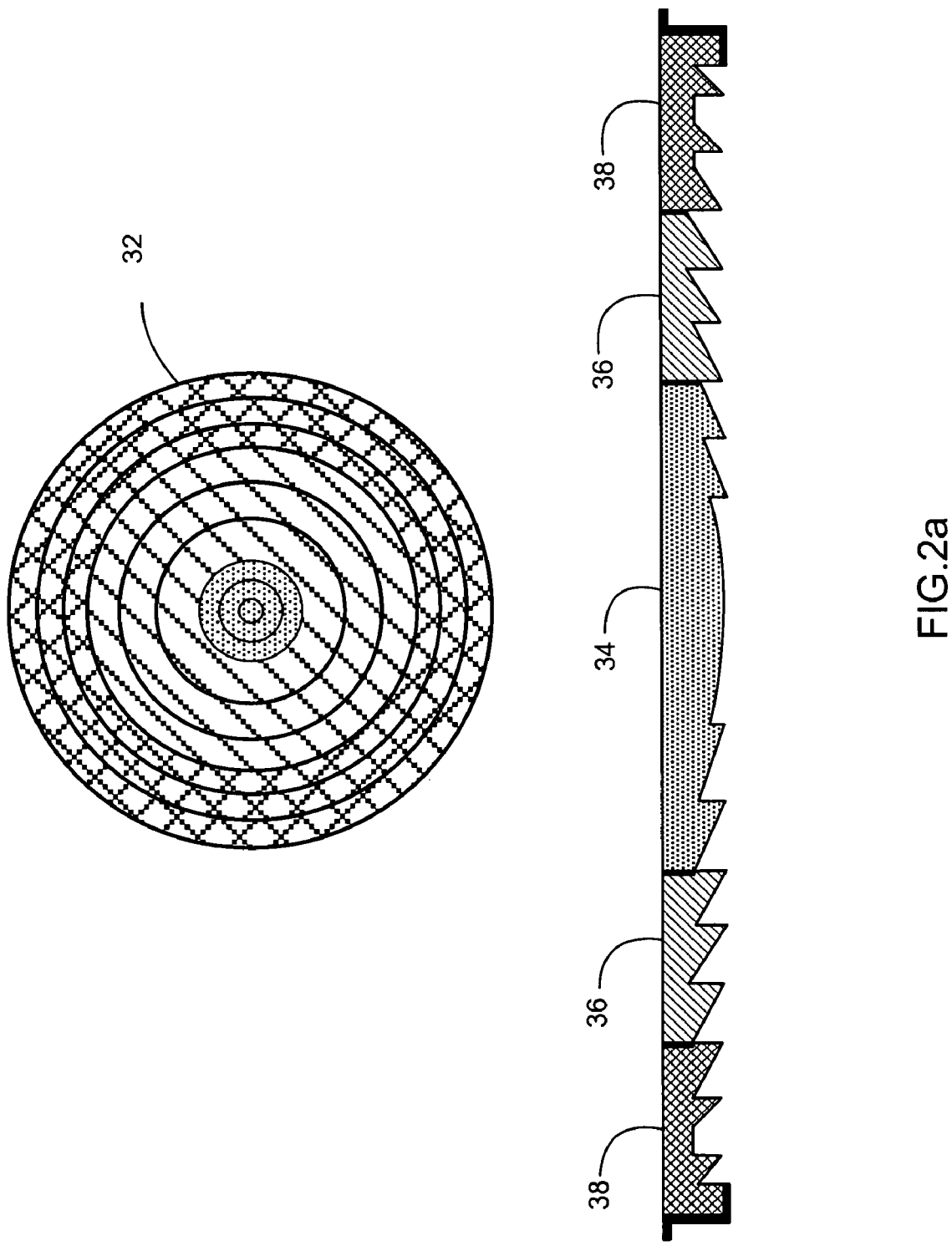
FIG. 2A illustrates the Fresnel lens of the present concentrating solar receiver.

Referring to FIG. 2A, the Fresnel lens of the present concentrating solar receiver is described. A perspective from above the Fresnel lens 32 illustrates the central round facet surrounded by a plurality of concentric circular facets. From the central facet, the width of each successive adjacent facet decreases while the radius of curvature increases. All of the facets are of the same height. The overall diameter of the Fresnel lens 32 is equivalent to or slightly larger than the diameter of the thermal cycle engine receiver. To maximize the amount of solar energy refracted, each section of the Fresnel lens is constructed of a different material. The central section 34 utilizes an ultraviolet transmitting acrylic. Polycarbonate occupies the middle section 36. Finally, the outer section consists of an infrared compatible polycarbonate 38. This allows greater transmittance of a wider range of wavelengths. The number of sections and combination of materials used in the Fresnel lens is not limited to the three described.

Continuing with FIG. 2B, the Fresnel lens support assembly 42 is shown. It is illustrated as seen from above without the Fresnel lens sections. It is composed of three circular rings each of which corresponds to the outer diameter of the Fresnel lens sections. Constructed of aluminum, the Fresnel lens support assembly 42 would be resistant to corrosion, lightweight, and strong enough to provide stability. A cross section view of the Fresnel lens support assembly shows the placement of flanges 44 used to secure each Fresnel lens section. The size of these flanges would be minimized to allow the greatest amount of refraction of solar energy through each Fresnel lens section.

Figure 3:
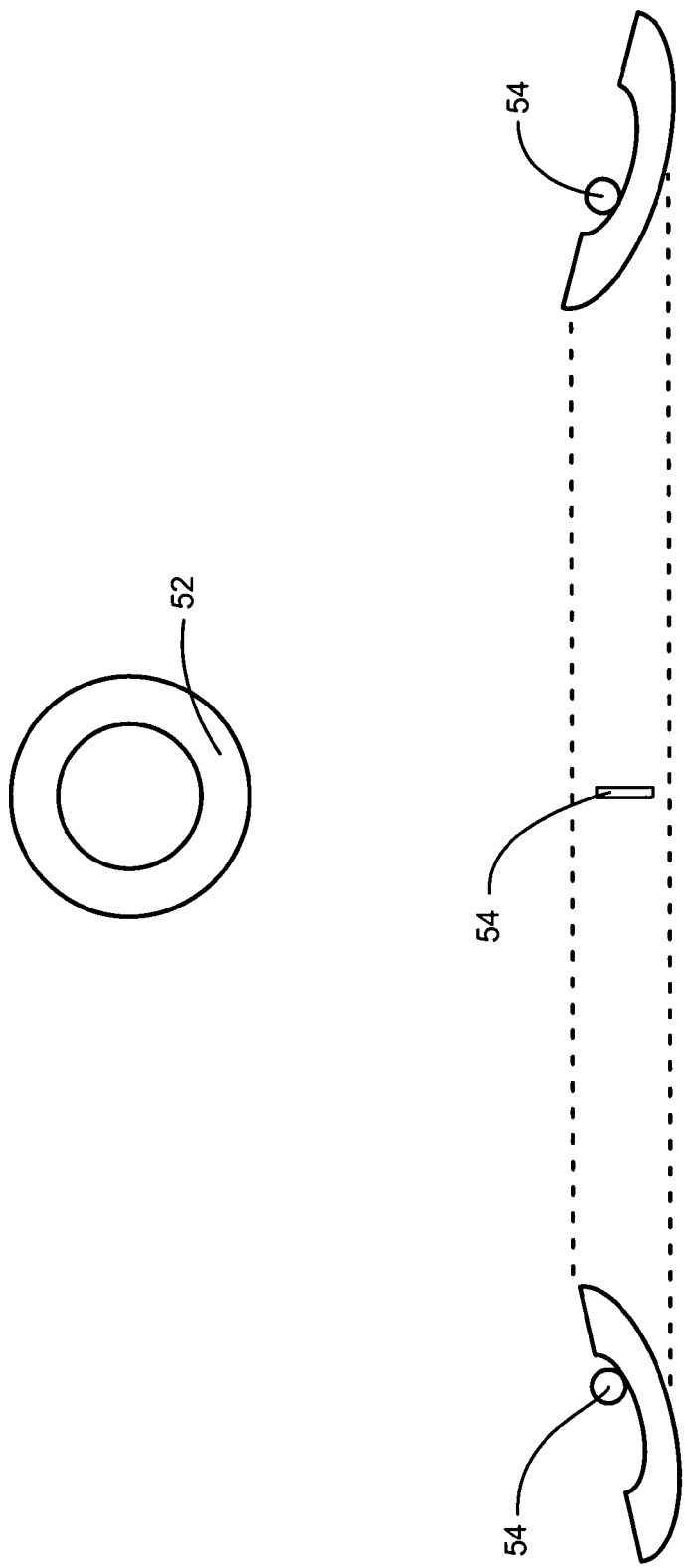
FIG. 3 illustrates the secondary reflector of the present concentrating solar receiver.

FIG. 3 describes the secondary reflector 52. It is circular in shape with an outer diameter equivalent to the outer diameter of the Fresnel lens. The inner diameter is large enough to allow solar energy refracted by the Fresnel lens to pass through. This gives the secondary reflector 52 a "donut shaped" appearance when viewed from above. It is constructed of polished aluminum with a convex surface oriented away from the Fresnel lens and toward the primary reflector. This convex surface redirects concentrated solar energy from the primary reflector to the receiver of a thermal cycle engine. A cross section view of the secondary reflector illustrates the mounting points 54. Three mounting points 54 are utilized to attach the secondary reflector to the support struts of the present concentrating solar receiver. They are located on the non-reflective concave side of the secondary reflector.

Figure 4:
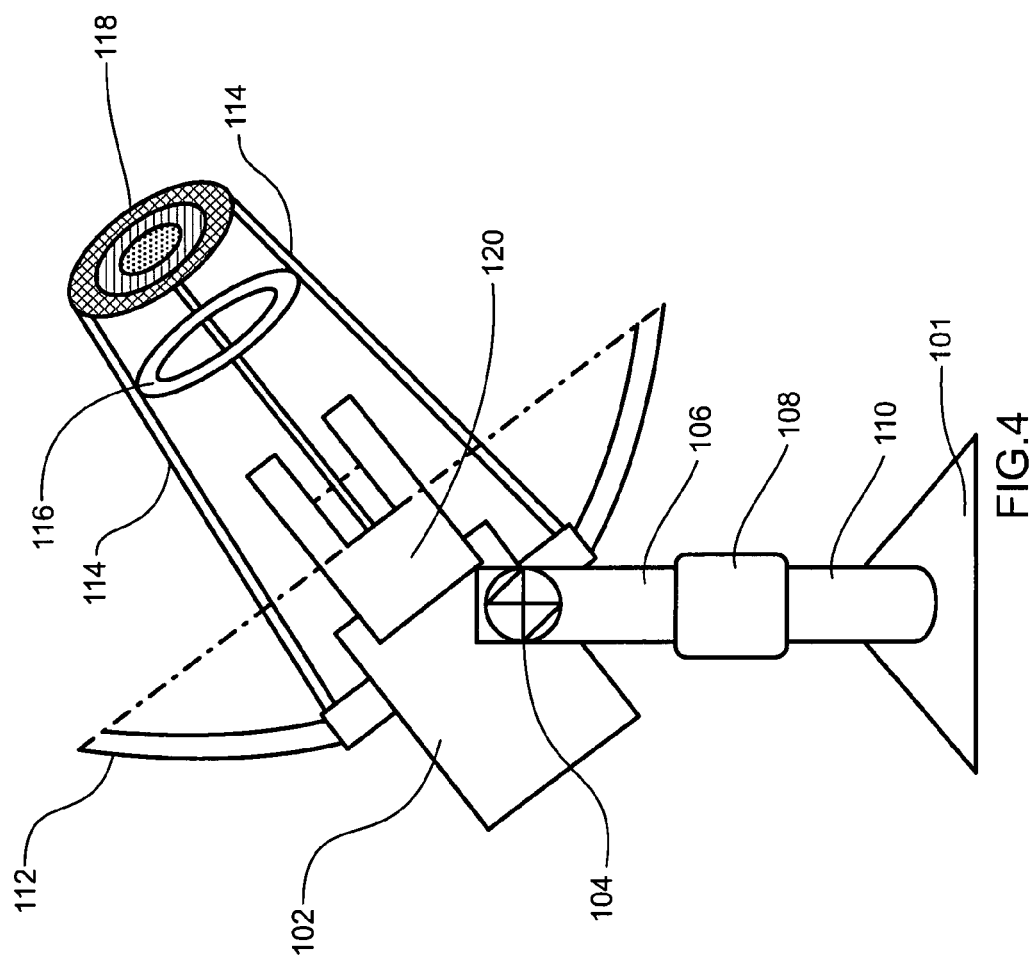
FIG. 4 illustrates the preferred embodiment of the present concentrating solar receiver.

FIG. 4 shows the preferred embodiment of the present invention. An electric generator 102 is coupled to a thermal cycle engine receiver 120. The mass of these two components comprise the majority of the total mass of the present concentrating solar receiver; therefore, the center of gravity 104 is located approximately at the center of the rotating vertical support post 106 and slightly below the center of the primary reflector 112. This placement simplifies the supporting structure needed to provide azimuth and elevation movement during tracking of the sun. Sun tracking devices have been developed and would be used in conjunction with the present invention to ensure the maximum capture of solar energy.

However, they will not be described further. A horizontal drive motor 108 is located between the stationary vertical support post 110 which is connected to base 101, and the rotating vertical support post 106 and facilitate the rotation of the present concentrating solar receiver by rotating the rotating vertical support post 106 in response to a sun tracking sensor. A vertical drive motor located at the top of the rotating vertical support post 106 allows elevation adjustment. The center of the primary reflector 112 is flat in shape out to a diameter equal to the Fresnel lens 118. Three support struts 114 are mounted at the outer edge of this flat section and extend above the primary reflector 112. The secondary reflector 116 and Fresnel lens 118 are mounted along these support struts 114 as previously described.

Figure 5:
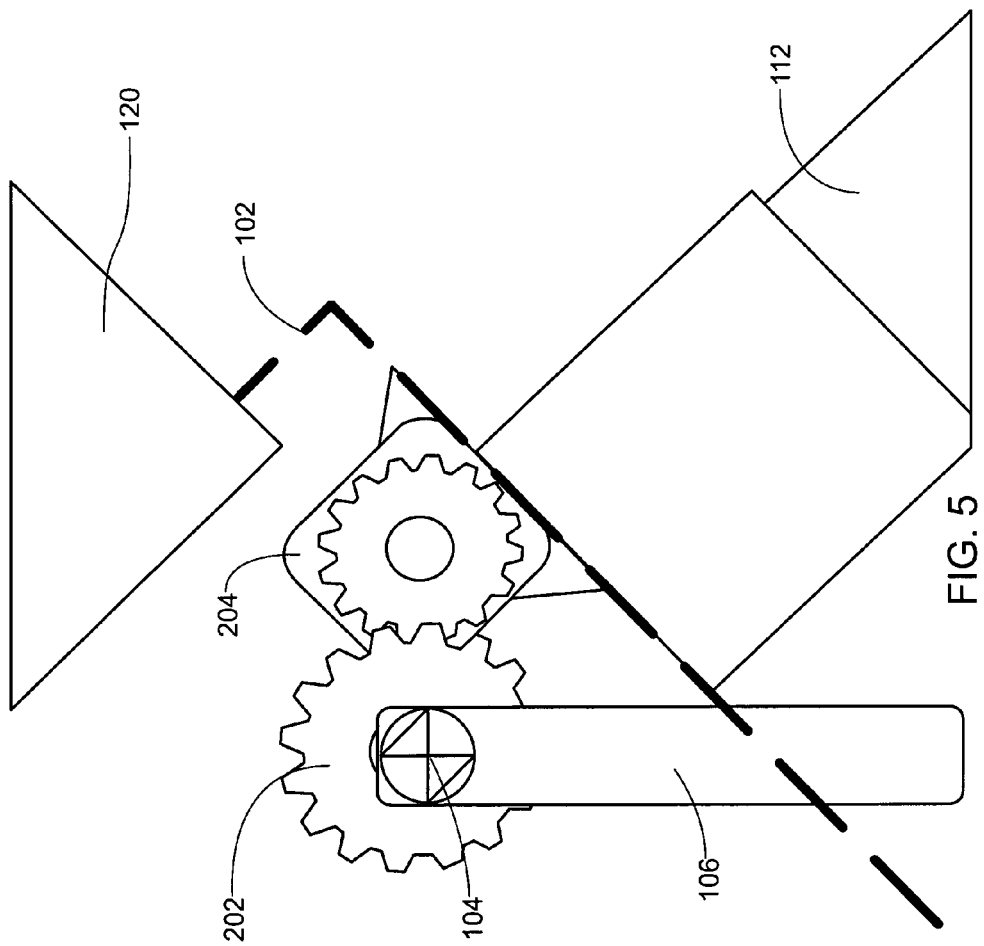
FIG. 5 illustrates the vertical drive motor of the present concentrating solar receiver.

Finally, FIG. 5 illustrates the vertical drive motor. The stationary gear 202 is disk shaped and located at the top of the rotating vertical support post 106. It bisects the rotating vertical support post 106 with its long axis parallel to the long axis of the post. The center of the stationary gear 202 is positioned at the center of gravity 104 of the concentrating solar receiver. The vertical drive motor 204 is mounted inside the housing of the electric generator 102. It is offset from the centerline of the concentrating solar receiver to allow its pinion to engage the stationary gear 202. The up and down position of the primary reflector 112 and the thermal cycle engine receiver 120 are moved using the vertical drive motor.

What is claimed is:

1. A concentrating solar receiver that maximizes the amount of solar energy available for conversion to electricity comprising:
   a. a primary reflector;
   b. a secondary reflector;
   c. a thermal cycle engine receiver;
   d. a driveshaft;
   e. a Fresnel lens;
   f. an electric generator;
   g. a rotating vertical support post;
   h. a stationary vertical support post;
   i. a vertical drive motor;
   j. a horizontal drive motor;
   k. a stationary gear;
   l. a plurality of support struts; and
   m. a sun tracking sensor; and
   n. a base wherein said stationary vertical support post is located on top of said base and said horizontal drive motor is located at the top of said stationary vertical support post and said horizontal drive motor rotates said rotating vertical support post located above said horizontal drive motor and move said rotating vertical support post in a circular motion directed by said sun tracking sensor; and wherein said stationary gear is located at the top of said rotating vertical support post and said stationary gear bisects said rotating vertical support post such that said stationary gear's long axis is parallel to the long axis of said rotating vertical support post; and wherein said vertical drive motor is mounted inside said electric generator housing and moves around said stationary gear in response to said sun tracking sensor; and wherein said electric generator is coupled to said thermal cycle engine receiver using said drive shaft to form a center of gravity between the center of said rotating vertical support post and below the center of said primary reflector; and wherein a first plurality of energy rays are focused from said primary reflector and said first plurality of energy rays are intercepted by said secondary reflector to focus said first plurality of energy rays to a first focal point located at a first empty space located above said thermal cycle engine receiver thereby protecting said thermal cycle engine receiver from high temperatures produced by said first focal point and providing uniform density of solar energy within said thermal cycle engine receiver; and wherein a second plurality of energy rays are refracted from said Fresnel lens toward the first focal point located at the first empty space which said first empty space is located above said thermal cycle engine receiver thereby protecting said thermal cycle engine receiver from high temperatures produced by said first focal point and providing uniform density of solar energy within said thermal cycle engine receiver; and wherein said primary reflector is flat in shape out to a first diameter equal to the diameter of said Fresnel lens; and wherein said plurality of support struts are mounted at the outer edge of said first diameter of said primary reflector at equidistant locations along said first diameter and extend upwards and wherein said secondary reflector and said Fresnel lens are mounted along said plurality of support struts; and wherein said thermal cycle engine converts solar energy to mechanical energy; and wherein said driveshaft connecting said thermal cycle engine and said electric generator coveys said mechanical energy to said electric generator; and wherein said electric generator converts said mechanical energy to electric energy.

2. The concentrating solar receiver of claim 1 wherein said primary reflector is a single parabolic dish.

3. The concentrating solar receiver of claim 1 where in said primary reflector is a plurality of reflective panels arranged in a parabolic shape.

4. The concentrating solar receiver of claim 1 wherein said primary reflector comprises a reflective parabolic configuration of a material selected from the group consisting of a metal, a polymer, a fiberglass composite, a glass, a ceramic and any composite or combination of these.

5. The concentrating solar receiver of claim 4 wherein said primary parabolic reflector comprises an outline, when viewed from said principle axis, selected from the groups consisting of circular, oval, elliptical, rectangular and any regular polygon or other closed plane figure.

6. The concentrating solar receiver of claim 1 wherein said Fresnel lens is comprised of a central round facet surrounded by a plurality of concentric circular facets that decrease in width and are uniform in height, thereby increasing the radius of the curvature of said Fresnel lens.

7. The concentrating solar receiver of claim 6 wherein each section of said plurality of concentric circular facets said Fresnel lens is comprised of different materials.

8. The Fresnel lens of claim 7 wherein the first section of said plurality of concentric circular facets is comprised of an ultraviolet transmitting acrylic, the second section of said plurality of concentric circular facets is comprised of polycarbonate, and the third section of said plurality of concentric circular facets is comprised of infrared compatible polycarbonate.

9. The concentrating solar receiver of claim 1 wherein the diameter of said Fresnel lens is equivalent to the diameter of said thermal cycle engine receiver.

10. The concentrating solar receiver of claim 1 wherein the diameter of said Fresnel lens is greater than the diameter of said thermal cycle engine receiver.

11. The concentrating solar receiver of claim 1 wherein said Fresnel lens is mounted to said plurality of support struts using flanges of a size to allow the greatest amount of refraction of solar energy through said Fresnel lens and still safely and sufficiently secure said Fresnel lens to said plurality of support struts.

12. The concentrating solar receiver of claim 1 wherein said secondary reflector has a convex surface oriented away from said Fresnel lens and oriented towards said primary reflector.

13. The concentrating solar receiver of claim 12 wherein said secondary reflector has an outside diameter equivalent to the outer diameter of said Fresnel lens.

14. The concentrating solar receiver of claim 12 wherein the inside diameter of said secondary reflector is large enough to allow said second plurality of energy rays through said secondary reflector without interfering with interception of said first plurality of energy rays.

15. The concentrating solar receiver of claim 1 wherein said secondary reflector is comprised of a material selected from the group consisting of a metal, a polymer, a fiberglass composite, a glass, a ceramic and any composite or combination of these.

16. The concentrating solar receiver of claim 1 wherein said thermal cycle engine is a Stirling engine.

* * * * *